(12) United States Patent
Sakamoto et al.

(10) Patent No.: US 8,093,805 B2
(45) Date of Patent: Jan. 10, 2012

(54) VAPOR DEPOSITION MASK, ORGANIC ELECTROLUMINESCENT DISPLAY DEVICE, AND MANUFACTURING METHOD THEREFOR

(75) Inventors: Yoshiaki Sakamoto, Kanagawa (JP); Toshiro Takahashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 967 days.

(21) Appl. No.: 11/441,204

(22) Filed: May 26, 2006

(65) Prior Publication Data

US 2006/0279202 A1   Dec. 14, 2006

(30) Foreign Application Priority Data

May 27, 2005 (JP) ................................ 2005-155615

(51) Int. Cl.
*H01J 1/62* (2006.01)
*H01J 63/04* (2006.01)
(52) U.S. Cl. ........ 313/506; 313/483; 313/500; 313/501; 313/502; 313/503; 313/504; 313/505
(58) Field of Classification Search .................... None
See application file for complete search history.

(56) References Cited

U.S. PATENT DOCUMENTS

| 6,900,470 B2* | 5/2005 | Kobayashi et al. ............. 257/88 |
| 7,042,154 B2* | 5/2006 | Kobayashi ..................... 313/506 |
| 7,224,115 B2* | 5/2007 | Sato et al. ..................... 313/504 |
| 2002/0158835 A1* | 10/2002 | Kobayashi et al. ........... 345/100 |
| 2003/0201708 A1* | 10/2003 | Yamada et al. ................ 313/495 |
| 2004/0160170 A1* | 8/2004 | Sato et al. ..................... 313/504 |

FOREIGN PATENT DOCUMENTS

| JP | 10-261491 A | 9/1998 |
| JP | 2001296819 A | 10/2001 |
| JP | 2002-318556 A | 10/2002 |
| JP | 2003-123988 A | 4/2003 |
| JP | 2003-316291 A | 11/2003 |
| JP | 2004-207217 A | 7/2004 |
| JP | 2005-129519 A | 5/2005 |

* cited by examiner

*Primary Examiner* — Natalie Walford
(74) *Attorney, Agent, or Firm* — Birch, Stewart, Kolasch & Birch, LLP

(57) ABSTRACT

In an organic electroluminescent display device comprising a wiring layer, an insulating layer, a first electrode, an organic electroluminescent layer, and a second electrode, wiring which conducts with a second electrode is arranged between light emitting pixels, and is provided either between an organic electroluminescent layer and the second electrodes, or on top of the second electrodes.

10 Claims, 11 Drawing Sheets

VAPOR DEPOSITION MASK, ORGANIC ELECTROLUMINESCENT DISPLAY DEVICE, AND MANUFACTURING METHOD THEREFOR

CROSS-REFERENCE TO RELATED APPLICATION

This application claims priority under 35 USC 119 from Japanese Patent Application, No. 2005-155615, the disclosure of which is incorporated by reference herein.

BACKGROUND OF THE INVENTION

1. Field of the Invention

The present invention relates to a vapor deposition mask, an organic electroluminescent (hereunder EL) display device, and a manufacturing method therefor. In particular the present invention relates to a vapor deposition mask in an active matrix drive organic EL display device of a top emission type, an organic EL display device, and a manufacturing method therefor.

2. Description of the Related Art

As a display device which can be made thin and lightweight as compared to conventional cathode-ray tubes (CRT) and liquid crystal displays (LCD), a display device using organic EL elements has recently attracted a great deal of attention.

Since the organic EL element is self light emitting, it has various characteristics such as, the visibility is high, there is no viewing angle dependency, a film substrate having flexibility can be used, and it is thin and lightweight as compared to the liquid crystal display.

In conventional organic EL display devices, for example an anode made from a transparent conductive film such as indium tin oxide film (hereunder ITO) is formed on an insulation substrate made from a glass substrate, and on this anode is formed an organic EL layer containing a luminous layer which generates light by recombination of electrons and positive holes. Furthermore, on the organic EL layer is formed a cathode made from Al or Mg—Ag alloy or the like. That is to say, on the insulation substrate is formed the anode, the organic EL layer, and an organic EL element comprising the cathode. Normally, the light generated in the luminous layer of the organic EL layer is emitted from the insulation substrate side, giving a so-called bottom emission type.

Furthermore, in order to realize a high definition display, advance is being made together with the organic EL element, for the development of a display device of an active matrix type having switching elements such as thin film transistors (hereunder TFT).

In the aforementioned bottom emission type organic EL display device, a switching element such as a thin film transistor which controls the drive voltage applied to the organic EL element, shuts out the light generated in the luminous layer of the organic EL layer (has an influence on the organic EL layer). Hence the aperture ratio for the generated light with respect the entire bottom surface of the device is reduced.

Therefore, recently, so that the switching element does not cause a shadow, development is progressing for a top emission type organic EL display device where the upper section common electrode is made as a transparent or semi-transparent optical transmission electrode, and light is emitted from the upper electrode side.

In this case, for example the ITO constituting the common electrode of the upper section is formed at a low film forming temperature of 100° C. or less so as to not deteriorate the organic EL layer of the lower layer. Moreover in order to maintain the optical transmission, the film thickness is made approximately 150 nm.

However, generally for transparent conductive bodies, the electrical resistance is large to become 30Ω per □ with the aforementioned construction. In the organic EL element for the current drive, a large current is necessary at the time of high intensity emission, and due to the wiring resistance and the large current of the electrical path, an excessive load is applied to a power source.

That is to say, a voltage for where a voltage drop part comprising the product of the wiring resistance and the electrical current is subtracted from a power source voltage, becomes an effective voltage for the organic EL device.

In this case, since a resistivity of a metal wiring inside the TFT substrate is 0.2 ohms per □, then for the wiring resistance and the voltage drop in the electrical path, the high resistance of the common electrode becomes a predominant factor. Since the common electrode is connected to the metal wiring inside the substrate at the outer periphery of the screen, then at the closest portion (screen outer periphery) and the remotest portion (the screen center) from the connecting locus of the common electrode, the length of the electrical path of the common electrode becomes different, so that the screen center has a high resistance load caused by the common electrode.

Moreover, when the whole screen is lit, that is to say, when all the pixels are energized, the current of each pixel becomes superimposed from the screen center towards the common electrode connection portion of the screen outer periphery. Therefore, the high resistance of the common electrode becomes multiplied so that the voltage drop of the screen center becomes greater than that for the screen outer periphery, and a difference occurs in the effective voltage of each of the organic EL elements, giving rise to brightness unevenness.

This brightness unevenness becomes a display quality loss. The larger the display is, the more conspicuous the brightness unevenness is since the area for light emission is large so that a large current is necessary and the common electrical path becomes long.

In order to solve the brightness unevenness which is apt to happen in the top emission type organic EL display device, as shown in Japanese Patent Application Laid-Open Nos. 2002-318556 and 2004-207217, a method is proposed where auxiliary wiring for the common electrode is arranged at a TFT substrate. This is explained with reference to FIG. 15.

FIG. 15 is a schematic cross-section of a related art top emission type organic EL display device. A polysilicon island shape region 94 is formed on a glass substrate 91 via an SiN film 92 and an SiO$_2$ film 93. A gate electrode 96 made from Al is provided on the polysilicon island shape region 94 via a gate insulating film 95 made from SiO$_2$ film. An SiO$_2$ film 97 is provided so as to cover the whole surface, after which openings for the source-drain region are formed, and a source electrode 98 and a drain electrode 99 are formed, to thereby form a TFT as an active element.

Next, a positive type photosensitive polyimide is coated by a spin coating method, after which only the region corresponding to the source electrode 98 is exposed and developed, followed by baking. As a result, a flat insulating film 100 having contact holes 101 corresponding to the source electrode 98 is formed.

An Al film is deposited over the whole surface, after which a lower electrode 102 and auxiliary wiring 103 are formed by patterning in a predetermined shape. An SiO$_2$ film 104 is deposited over the whole surface, after which a through hole 105 which exposes the auxiliary wiring 103, and an aperture area which exposes the lower electrode 102 are formed.

Using a vapor deposition mask which is positioned so that a non-aperture area corresponds to the auxiliary wiring 103, a hole injection layer, a hole transport layer, and a light emitting layer are vapor deposited under heat in sequence to thereby form an organic EL layer 106. The vapor deposition mask is then removed, and an upper electrode 107 made from ITO is deposited over the whole surface, and the upper electrode 107 and the auxiliary wiring 103 are electrically connected.

Finally, as with a normal organic EL device, sealing is performed in a dry nitrogen atmosphere, by means of a sealing plate 108 made from glass using a UV adhesive, to thereby complete the top emission type organic EL display device.

In this manner, the upper electrode 107 made from ITO of a high specific resistance, is connected to the auxiliary wiring 103 made from Al of a low specific resistance. As a result, the voltage drop due to the upper electrode 107 is reduced, and hence the display characteristics are greatly improved.

However, the whole screen comprises the pixel aperture area where the organic EL layer emits light, and the non pixel aperture area other than this, and if the space for the auxiliary wiring 103 and the through hole 105 which are constructed in the non pixel aperture area is to be kept large, the pixel aperture area becomes small and an aperture ratio (a ratio of the pixel aperture area with respect to the entire top surface of the device, same hereunder) is lowered so that the brightness is reduced. In the configuration of Japanese Patent Application Laid-Open No. 2004-207217, the aperture ratio is around 30%.

Furthermore, even if the non pixel aperture are is made to the minimum value of the processing limits, the higher the definition of the device, the greater an occupation proportion of the non pixel aperture area, so that the aperture ratio is decreased. Therefore the configuration in the related arts is less advantageous for obtaining high intensity of light emission.

SUMMARY OF THE INVENTION

The present invention suppresses the area of a non pixel aperture area with the connection configuration for the auxiliary wiring and the common electrode through the through holes, and therefore increases the aperture ratio.

A first aspect of the present invention is an organic EL display device which comprises a wiring layer, an insulating layer, first electrodes, an organic EL layer, and second electrodes, each laminated in sequence on a substrate, and all of the second electrodes are in a same layer. The organic EL display device further comprises a plurality of light emitting pixels which radiate light emitted from the organic EL layer and transmitted through the second electrode. Furthermore, wiring which conducts with the second electrode is arranged between the light emitting pixels, and is provided either between the organic EL layer and the second electrodes, or on top of the second electrodes, to give an organic EL display device.

By arranging the wiring which conducts with the second electrode between the light emitting pixels, the through holes become unnecessary, and the voltage drop due to the second electrodes can be reduced without changing the aperture ratio of the light emitting pixels.

In the above aspect, the plurality of the wiring, which conduct with the second electrode, may be configured so that film forming pattern of the respective wiring is continuous such that at least a portion of mutual patterns is overlapped. That is to say, a pattern of a vapor deposition mask which is used for respective wiring is superimposed- and wiring of a predetermined shape is optionally formed. As a result, it is not necessary to provide the aperture area at a high density on the vapor deposition mask which is used, and hence the rigidity of the vapor deposition mask can be increased.

Furthermore, the configuration may be such that the wiring which conducts with the second electrode has a so-called bus wiring in which alternate wirings intersect each other and being tied in a region outside of the light emitting pixels. As a result, the voltage drop can be reduced in the panel peripheral portion, where the current for each pixel passes through the wiring to be concentrated, and the current becomes large.

In the aforementioned aspect, the wiring may be configured to have a plurality of shape elements, and at least one part of the shape elements is mutually overlapped.

In the aforementioned aspect, the plurality of shape elements of the wiring may be arranged in mutually staggered form.

In the aforementioned aspect, the wiring may be configured such that the plurality of shape elements of the wiring which conduct with the second electrode include a plurality of types of shape elements, and at least a part of the shape elements of this plurality of types is mutually overlapped.

Also in each of the aforementioned aspects, the voltage drop due to the second electrode can be reduced without having an influence on the aperture ratio. Furthermore, by superimposing the pattern of the vapor deposition mask which is used, and optionally forming wiring of a predetermined shape, it is no longer necessary to provide aperture areas in a high density on the vapor deposition mask which is used, and the rigidity of the vapor deposition mask can be increased.

In the aforementioned aspect, the shape elements of the plurality of types of wiring which conducts with the second electrode comprise a first shape element and a second shape element, and the second shape element is arranged on an outer periphery of a region where the first shape element is arranged.

In the aforementioned aspect, the plurality of second shape elements may be arranged with positions shifted from each other, on an outer periphery of a region where the first shape element of the wiring which conducts with the second electrode is arranged.

According to each of the above aspects, the voltage drop due to the second electrode can be reduced without influencing the aperture ratio. Furthermore, the current of each pixel passes through the wiring and the current is concentrated, and the voltage drop in the panel peripheral portion where the current becomes large, can be reduced.

In a second aspect of the present invention, there is a vapor deposition mask which is used when constructing the organic EL display device, and which has a plurality of first aperture areas with a length $L_1$ and a width $W_1$. The plurality of first aperture areas are arranged at a pitch $P_1$ in the length direction of the vapor deposition mask, and at a pitch $P_2$ in the width direction, and satisfy the relationships of $L_1 > P_1/2$, and $W_1 < P_2/2$.

As a result, it is not necessary to provide a high density aperture area on the vapor deposition mask, and the rigidity of the vapor deposition mask can be increased. Moreover, the dimensional accuracy of the aperture pattern of the vapor deposition mask can be easily maintained.

In the aforementioned aspect, second aperture areas of length $L_2$ and width $W_2$ may be multiply arranged in the width direction of the vapor deposition, so as to satisfy the relationships of pitch $P_3=P_2 \times m$ (where m is an integer of one or more), and $W_2 < P_3$.

In the above aspect, third aperture areas of length $L_3$ and width $W_2$ may be multiply arranged in the width direction of the vapor deposition mask, so as to satisfy the relationships of pitch $P_3=P_2 \times m$ (where m is a integer of one or more), and $W_2 < P_3$.

According to these aspects, a desired wiring is obtained without providing a high density aperture area for the vapor deposition mask. Consequently, the rigidity of the vapor deposition mask can be increased, and the dimensional accuracy of the aperture pattern of the vapor deposition mask is easily maintained.

In the aforementioned aspect, third aperture areas arranged at a pitch $P_3$ may be arranged in the mutual length direction, with the position shifted by $\delta$ satisfying $\delta < L_3$.

By using such a vapor deposition mask, bus wiring can be laid and deposited in optional directions.

In the aforementioned aspect, a slit aperture of width $W_1$ may be provided in the vicinity of the width $W_2$ of the third aperture area of the vapor deposition mask.

In the aforementioned aspect, a slit aperture area in the vicinity of the width $W_2$ of the third aperture area of the vapor deposition mask, may be arranged at two or more locations, and the slit aperture area may be arranged so that a pitch $P_4=P_2 \times k$ (where k is an integer of one or more) in the width direction of the first aperture area is satisfied, and the first aperture area is provided between a plurality of the slit aperture areas arranged in parallel.

By using such a vapor deposition mask, wiring wherein the third aperture area and the first aperture area are superimposed is obtained by means of the slit aperture.

Furthermore, since a highly detailed wiring pattern configuration is obtained without forming a high density aperture area in the vapor deposition mask, the rigidity of the vapor deposition mask can be increased.

In the aforementioned aspect, the plurality of second aperture areas may be provided on the outer periphery of a region where the plurality of first aperture areas is arranged.

In the aforementioned aspect, the plurality of third aperture areas may be provided on the outer periphery of a region where the plurality of first aperture areas is arranged.

By using such a vapor deposition mask, the current of each pixel passes through the wiring and the current is concentrated, and a wiring is obtained which can reduce the voltage drop in the panel peripheral portion where the current becomes large.

A third aspect of the present invention is a manufacturing method for an organic EL display device. The organic EL display device comprises laminating on a substrate in sequence from the substrate side, a wiring layer, an insulating layer, a first electrode, an organic EL layer, and a second electrode and forming all of the second electrodes in the same layer. The display device has a plurality of light emitting pixels which radiate light emitted from the organic EL layer and is transmitted through the second electrode. The manufacturing method comprises either before or after forming the second electrodes, the aforementioned vapor deposition mask is used to deposit wiring material on the substrate, and then the aforementioned vapor deposition mask is moved with respect to the substrate on which the wiring material has been deposited by $(P_2/2) \times (2n-1)$ (where n is an integer of one or more) in the width direction of the first aperture area of the vapor deposition mask, and further the wiring material is deposited, to thereby form a wiring which conducts with the second electrode.

By the aforementioned manufacturing method, a desired wiring can be obtained without providing a high density aperture area on the vapor deposition mask, and the voltage drop due to the second wiring layer can be reduced without having an influence on the aperture ratio. Furthermore, the rigidity of the vapor deposition mask is improved, and dimensional accuracy of the aperture pattern is easily maintained.

In the embodiments of the invention, by directly forming the auxiliary wiring on the upper face or lower face of the common electrode, the connection between the common electrode and the auxiliary wiring is reliably obtained, and a through hole connection configuration becomes unnecessary. Therefore the aperture ratio can be increased, the voltage drop due to the second electrode can be reduced, and a high intensity can be obtained.

In particular, by making the aperture pattern in the vapor deposition mask for forming the auxiliary wiring, a mesh pattern by the aperture dimensions and the arrangement pitch, a desired wiring is obtained, and also the rigidity of the vapor deposition mask is improved, and the dimensional accuracy of the aperture pattern is easily maintained.

BRIEF DESCRIPTION OF THE DRAWINGS

Embodiments of the present invention will be described in detail based on the following figures, wherein.

DETAILED DESCRIPTION OF THE INVENTION

In one embodiment of the present invention, a wiring layer, an insulating layer, a first electrode, and an organic EL layer are sequentially laminated on a substrate. Either before or after forming a second electrode, wiring material is vapor deposited on the substrate via a vapor deposition mask on which a plurality of first apertures of length $L_1$ and width $W_1$ are arranged at a pitch $P_1$ in the length direction thereof, and at a pitch $P_2$ in the width direction, so as to satisfy a relationship of $L_1>P_1/2$, and $W_1<P_2/2$. Furthermore, the wiring material is vapor deposited with the vapor deposition mask moved with respect to the substrate by just $(P_2/2)\times(2n-1)$ (where n is an integer of one or more) in the width direction of the first aperture area, and auxiliary wiring which conducts with a second electrode is formed.

First Example

Here, a top emission type organic EL display device of a first example of the present invention is explained, with reference to FIG. 1 through FIG. 4.

Figure 1:
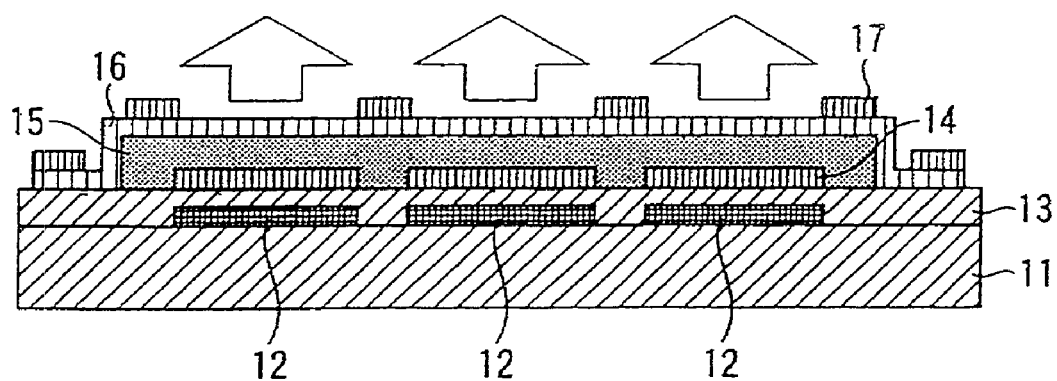
FIG. 1 is a schematic cross-section view of a top emission type organic EL device of a first example of the present invention.

As shown in FIG. 1, at first, pixel circuits 12 for controlling the electric light emission of each pixel are formed on an insulation substrate 11 made of a glass, resin film, or the like after which pixel electrodes 14 corresponding to each pixel circuit 12 are formed via an interlaminar insulating layer 13.

These pixel electrodes 14 are electrically connected to the pixel circuits 12 via contact holes (not shown) provided in the interlaminar insulating layer 13.

Next, an organic EL layer 15 and a common electrode 16 made from ITO, are sequentially mask vapor deposited on each of the pixel electrodes 14, after which, in order to evenly reduce the resistance of the common electrode 16, Al or Ag is vapor deposited using a vapor deposition mask, to thereby form auxiliary wiring 17 between the pixels (inter-pixel auxiliary wiring 18) and on the screen outer periphery (auxiliary wiring connection portion 19).

Figure 2:
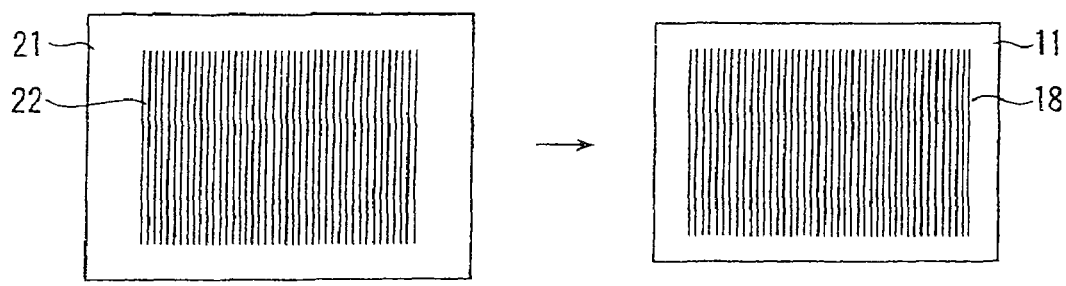
FIG. 2 is an explanatory drawing of formation for inter-pixel auxiliary wiring.

FIG. 2 is an explanatory drawing of the formation for the inter-pixel auxiliary wiring 18. Using a vapor deposition mask 21 having lengthwise stripe shape aperture areas 22 arranged at a spacing corresponding to the pixel pitch, inter-pixel auxiliary wiring 18 is formed on the common electrode 16 provided on the insulation substrate 11.

Figure 3:
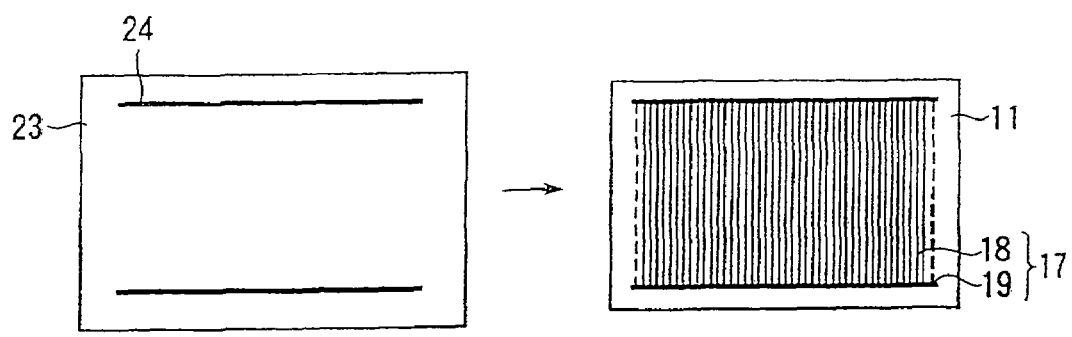
FIG. 3 is an explanatory drawing of formation for an auxiliary wiring connection portion.

FIG. 3 is an explanatory drawing of the formation for the auxiliary wiring connection portion 19. Using a vapor deposition mask 23 having two transverse stripe shape aperture areas 24, auxiliary wiring connection portions 19 are formed outside of the pixel region of the common electrode 16 which is provided with the inter-pixel auxiliary wiring 18. The each auxiliary wiring connection portion 19 has wider width than the each inter-pixel auxiliary wiring 18.

In particular, in forming a multi-colored organic EL layer such as an RGB three primary color layer for obtaining a full color display, since a space is provided between the light emitting pixels (between pixel electrodes) for separately coating the colors, the auxiliary wiring 17 is provided on this space so that it does not projectively overlap with the pixel electrodes 14.

In the first example of the present invention, since the inter-pixel auxiliary wiring 18 is provided between the pixels, the resistance of the common electrode 16 made from ITO can be evenly reduced without changing the aperture area (the aperture ratio) of the organic EL layer, and hence brightness unevenness can be effectively reduced.

Furthermore, since the auxiliary wiring connection portions 19 which have wider width than the inter-pixel auxiliary wiring 18, are provided outside the pixel region where the most current flows, the voltage drop due to the large electric current outside of the pixel region can be reduced.

Figure 4A:
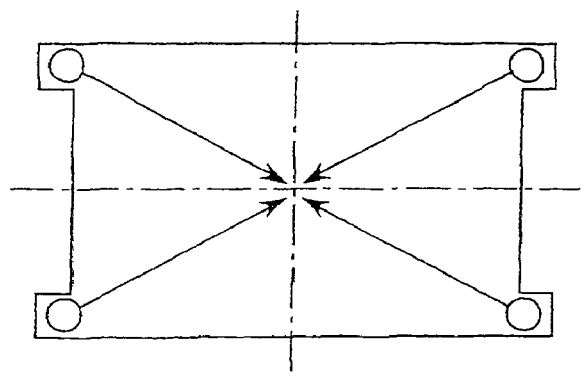
FIG. 4A and FIG. 4B are explanatory drawings of a resistance drop effect of a common electrode due to the auxiliary wiring.
Figure 4B:
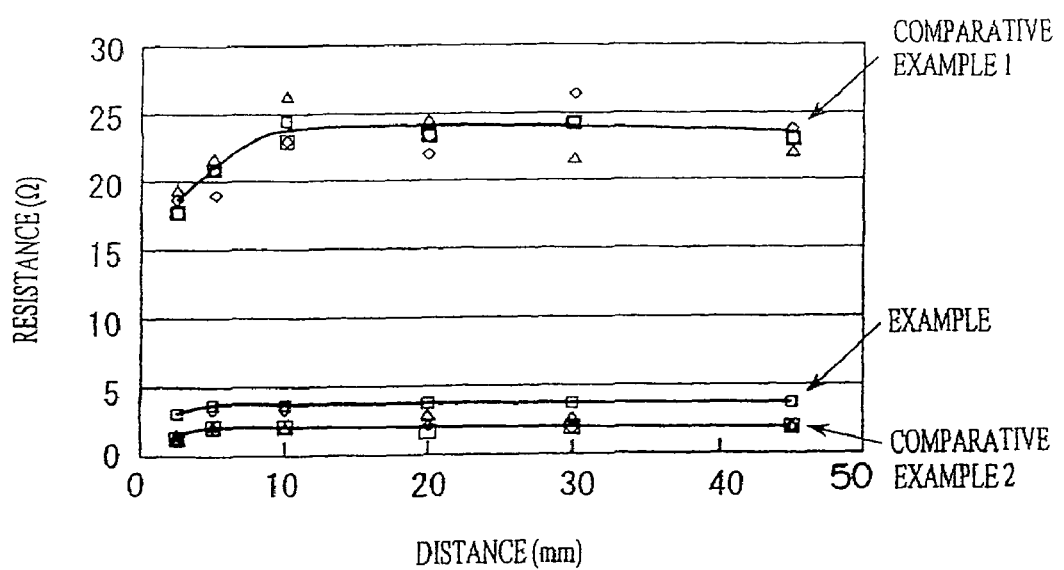

FIG. 4A and FIG. 4B are explanatory drawings of a resistance drop effect of the common electrode due to the auxiliary wiring. FIG. 4A is an explanatory drawing of a measurement method, and FIG. 4B is an explanatory drawing of measurement results.

As shown in FIG. 4A, external connection terminals for the common electrode are provided at four corners of the panel. The resistances of the common electrode according to the distance up to the screen center are measured, with the respective outside connection terminals as the starting point.

For the common terminal in this case, ITO of a thickness of 300 nm is used, and a panel provided with auxiliary wiring made from Ag of a thickness of 200 nm is measured. For comparison, a comparative example 1 provided with a common electrode of ITO with a thickness of 300 nm, and a comparative example 2 of a bottom emission type which uses Al of a thickness of 200 nm for the common electrode, are shown together.

As shown in FIG. 4B, in the comparative example 1, at a resistance distribution at 18 to 24 ohms, an intensity unevenness is seen where the low resistance screen corners emit in high intensity, while the high resistance screen center emits in low intensity.

On the other hand, in the case of the example 1 of the present invention, the resistance distribution becomes 3 to 4 ohms, which is a little higher than the 1 to 2 ohms of the comparative example 2, however, the intensity unevenness is hardly visible similar to the comparative example 2.

Second Example

Figure 5:
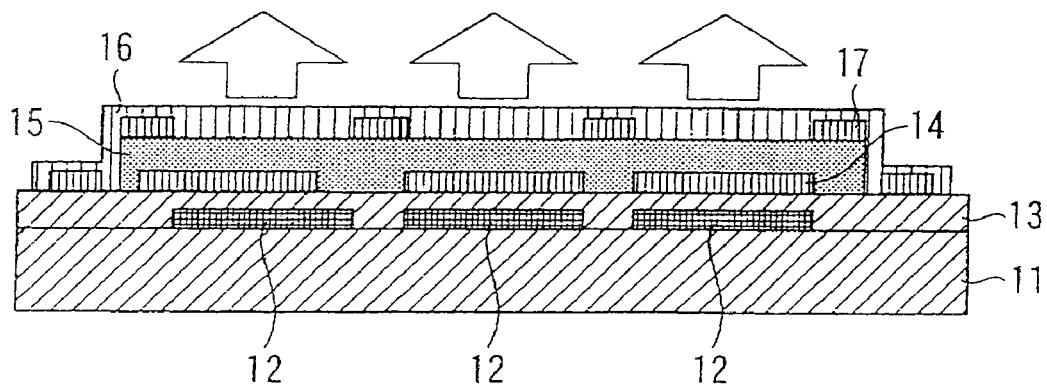
FIG. 5 is a schematic cross-section view of a top emission type organic EL device of a second example of the present invention.

A top emission type organic EL display device of a second example of the present invention is described with reference to FIG. 5. Since the vapor deposition mask which is used is the same as for the first example except that the position where the auxiliary wiring is provided is different, then only the cross-section configuration is shown.

As with the first example, pixel circuits 12 for controlling the electric light emission of each pixel are formed on an insulation substrate 11, after which pixel electrodes 14 corresponding to each pixel circuit 12 are formed via an interlaminar insulating layer 13. Then an organic EL layer 15 is vapor deposited on the pixel electrodes 14.

So that the organic EL layer is not deteriorated by moisture or oxygen and the like, the aforementioned vapor deposition mask 21 and a vapor deposition mask 23 are used, and inter-pixel auxiliary wiring 18 and auxiliary wiring connection portions 19 are vacuum formed in sequence manner on the organic EL layer 15. Then after forming auxiliary wiring 17, a common electrode 16 made from ITO is vapor deposited over the whole surface.

The resistance of the common electrode 16 can be evenly reduced, and the intensity unevenness can be effectively reduced without changing the aperture ratio of the organic EL layer. Furthermore, the voltage drop due to the large current outside of the pixel region can be reduced.

However, in the aforementioned first and second examples, forming the vapor deposition mask 21 having the aforementioned lengthwise stripe shape aperture areas 22 is difficult, and in particular, as stripe shape aperture areas 22 become highly detailed (narrow pitch), slippage deformation of the pattern accompanying a rigidity deterioration of the stripe portion occurs, and hence it becomes difficult to maintain the stripe shape.

In order to keep the stripe shape, the mask rigidity can be maintained by thinning a number of the stripes, however it becomes necessary to add a vapor deposition process for the thinned portion.

Third Example

A third example of the present invention is described. However since the basic structure is the same as for the aforementioned first example and second example, only the vapor deposition mask and the vapor deposition pattern are described.

Figure 6:
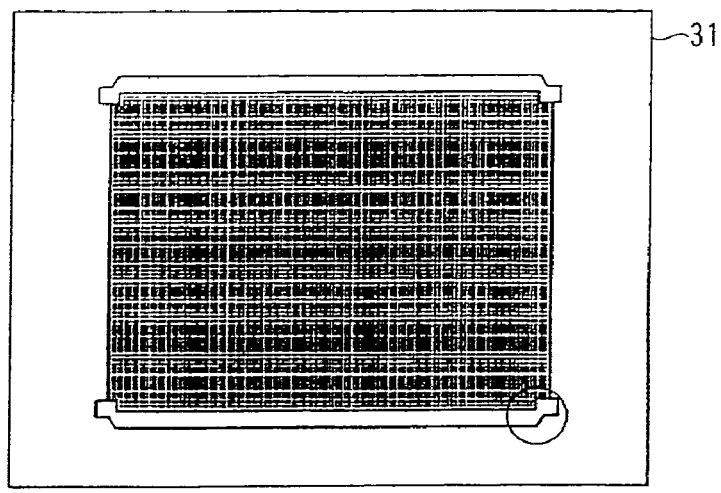
FIG. 6 is a plan view showing an overall vapor deposition mask used in a third example of the present invention.
Figure 7:
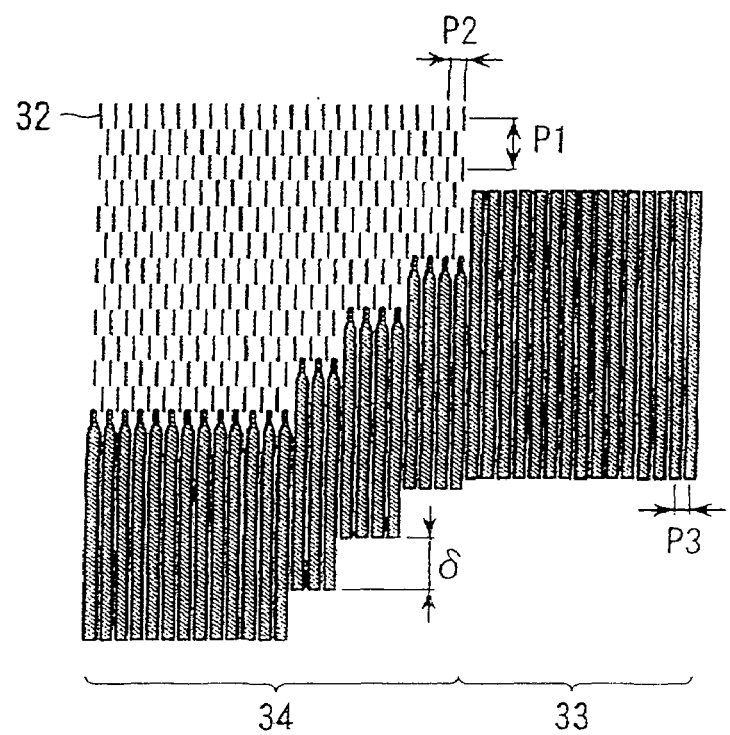
FIG. 7 is an enlarged view of a pattern region corner of the vapor deposition mask.

FIG. 6 is a plan view showing the overall vapor deposition mask used in the third example of the present invention. Furthermore, FIG. 7 is an enlarged view of a pattern region corner of the vapor deposition mask. The vapor deposition mask 31 comprises slit aperture areas 32 for inter-pixel auxiliary wiring, and slit aperture areas 33 and slit aperture areas 34 constituting auxiliary wiring connection portions.

Figure 8:
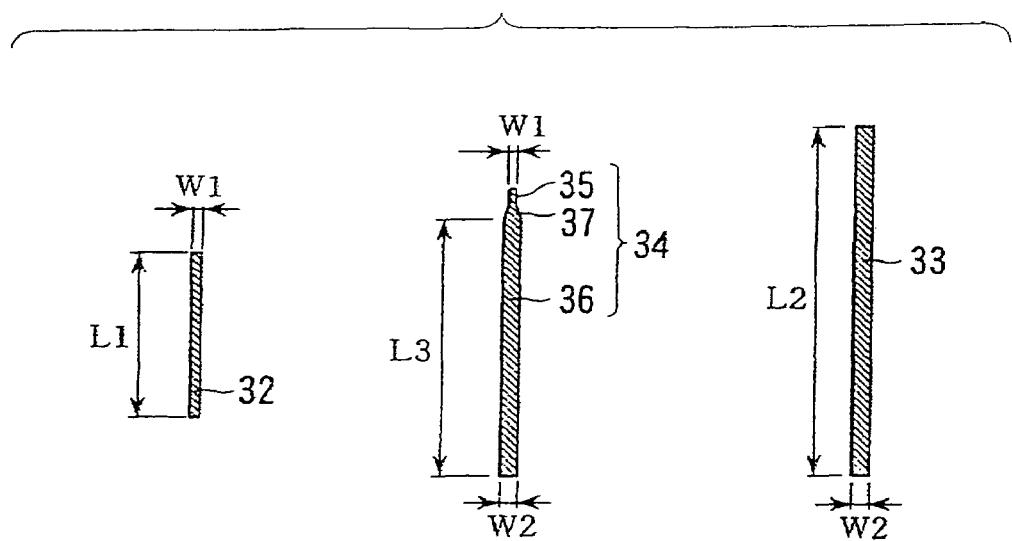
FIG. 8 is an explanatory drawing of a slit aperture area.

FIG. 8 is an explanatory drawing of the slit aperture areas of the deposition mask 31. The slit aperture area 32 for the inter-pixel auxiliary wiring is length $L_1$ and width $W_1$, and the slit aperture area 33 is length $L_2$ and width $W_2$. The slit aperture area 34 comprises a slit portion 35 of length $L_1/2$ and width $W_1$, a rectangular portion 36 of length $L_3$ and width $W_2$, and a connection portion 37.

As shown in FIG. 7, the slit aperture areas 32 for the inter-pixel auxiliary wiring are arranged at a pitch $P_1$ in the length direction, and a pitch $P_2$ in the width direction, thereof. Another slit aperture areas 32 are further arranged in positions of half of the respective pitches $P_1$ and $P_2$, giving a staggered array.

Furthermore, the slit aperture areas 33 and the slit aperture areas 34 are arranged at a pitch $P_3$ in the width direction thereof.

The slit portion 35 provided in the slit aperture area 34 must be positioned corresponding to the edge of the staggered array of the slit aperture areas 32, and hence $P_2$ is determined to be same to $P_3$.

Furthermore, some of slit aperture areas 34 are configured shifted by δ in the length direction, so that a bus wiring in an optional inclined direction can be formed.

Figure 9:
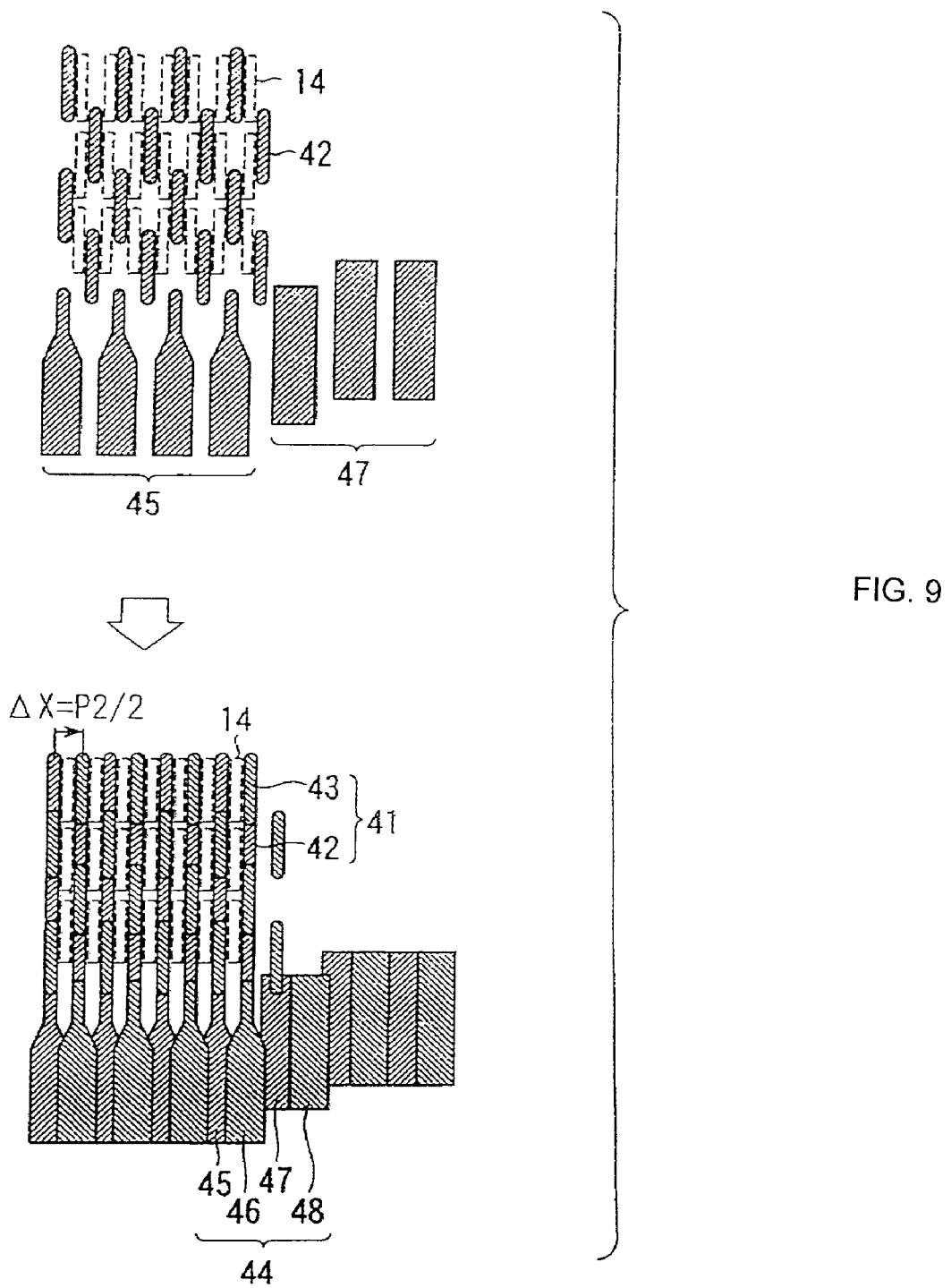
FIG. 9 is an explanatory drawing of formation for auxiliary wiring of the third example.

FIG. 9 is an explanatory drawing of formation for the auxiliary wiring of the third example. The aforementioned vapor deposition mask 31 is arranged at an origin position and film forming is performed to thereby form inter-pixel auxiliary wiring elements 42 and auxiliary wiring connection elements 45 and 47 (bus wiring element 45 and 47).

At this time, the origin position is set so that the slit aperture areas 32 are positioned in the regions between the adjacent pixel electrodes 14.

A film is formed at a position where the vapor deposition mask is moved by $P_3/2 = P_2/2$ in the width direction of the respective slit aperture areas, so that an inter-pixel auxiliary wiring elements 43, and bus wiring elements 46 and 48 are formed with being partly overlapped with the inter-pixel auxiliary wiring elements 42 and the bus wiring elements 45 and 47, respectively, which are previously formed. A plurality of inter-pixel auxiliary wiring 41 and bus wiring 44 are thereby formed.

A patterning overlapped width D of the respective slit aperture areas is determined as follows from the relationship of the pattern dimensions of the aforementioned slit aperture areas.

An overlap $D_1$ in the length direction of the inter-pixel auxiliary wiring elements 42 and 43 becomes:

$D_1 = L_1 - P_1/2$

Furthermore, an overlap $D_2$ in the length direction of the inter-pixel auxiliary wiring elements 42 or 43, and the bus wiring elements 45 or 46 becomes:

$D_2 = L_1 - P_1/2$

Moreover, an overlap $D_3$ in the width direction in each of the bus wiring elements 45 and 46, the bus wiring elements 47 and 48, or the bus wiring elements 46 and 47 becomes:

$D_3 = W_2 - (P_3/2)$

One example of the numerical values for the case where the auxiliary wiring is formed with the aforementioned vapor deposition mask 31, for a display device of RGB tricolor configuration is shown in Table 1.

TABLE 1

| Image size | | 64 mm × 48 mm | 3.2 type |
|---|---|---|---|
| Pixel number | | 320 × 240 | QVGA specification |
| Pixel pitch | | 0.2 mm | Definition 127 ppi |
| Sub-pixel region | | 0.067 mm × 0.2 mm | RGB tricolor configuration |
| Pixel electrode | | 0.042 mm × 0.19 mm | Aperture ratio 60% |
| Auxiliary wiring mask | P1 | 0.5 mm | Optional |
| | P2 | 0.134 mm | Two times sub-pixel pitch |
| | P3 | 0.134 mm | P3 = P2 |
| | L1 | 0.27 mm | L1 > (P1/2) |
| | W1 | 0.02 mm | Less than 0.025 mm between pixel electrodes |
| | L2 | 2.5 mm | Optional |
| | W2 | 0.1 mm | W2 > (P3/2) |
| Auxiliary wiring film overlapped width | D1 | 0.02 mm | D1 = L1 − (P1/2) |
| | D2 | 0.02 mm | D2 = L1 − (P1/2) |
| | D3 | 0.033 mm | D3 = W2 − (P3/2) |

In the third example of the present invention, since the stripe shape aperture area in which each stripe shape aperture has continuous long shape is not provided, the rigidity of the vapor deposition mask is increased, and the slippage deformation of the pattern can be suppressed. Furthermore, since the vapor depositions are performed two times, being the same as for the first example or the second example, the manufacturing processes are not increased.

Fourth Example

A fourth example of the present invention is described with reference to FIG. 10 through FIG. 12. However since the basic device structure is the same as for the aforementioned first example or second example, only the vapor deposition mask and the vapor deposition pattern is described.

Figure 10:
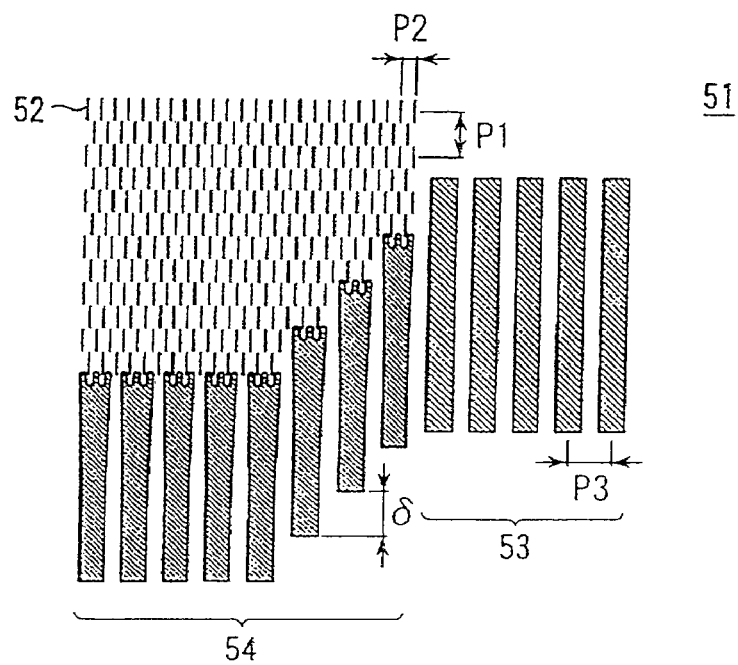
FIG. 10 is an enlarged view of a pattern region corner of a vapor deposition mask used in the fourth example of the present invention.

FIG. 10 is an enlarged view of a pattern region corner of a vapor deposition mask used in the fourth example of the present invention. The vapor deposition mask 51 comprises slit aperture areas 52 for inter-pixel auxiliary wiring, and slit aperture areas 54 and slit aperture areas 53 constituting auxiliary wiring connection portions.

Figure 11:
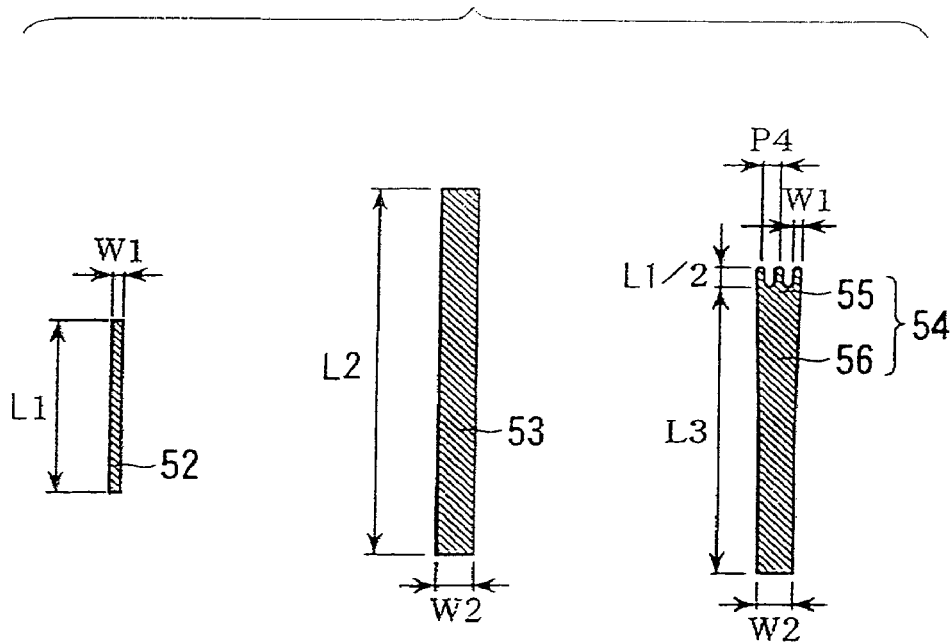
FIG. 11 is an explanatory drawing of a slit aperture area.

FIG. 11 is an explanatory drawing of the slit aperture areas. The slit aperture area 52 for the inter-pixel auxiliary wiring is length $L_1$ and width $W_1$, and the slit aperture area 53 for the auxiliary wiring connection portion is length $L_2$ and width $W_2$. Moreover, for the slit aperture area 54, on a tip end portion of a rectangular portion 56 of length $L_3$ and width $W_2$ there is provided three slit portions 55 at a pitch of $P_4$, of a length $L_1/2$ and width $W_1$.

As shown in FIG. 10, the slit aperture areas 52 for the inter-pixel auxiliary wiring are arranged at a pitch $P_1$ in the length direction thereof, and a pitch $P_2$ in the width direction thereof. Moreover another slit aperture areas 52 are arranged in positions of half of the respective pitches $P_1$ and $P_2$, giving a staggered array.

Furthermore, the slit aperture areas 53 and the slit aperture areas 54 are arranged at a pitch $P_3$ in the width direction thereof.

The slit portions 55 provided in the slit aperture area 54 must be positioned at the edge of the staggered array of the slit aperture areas 52, and hence the pitches are determined as $P_2 \times 3 = P_3$.

Furthermore, the plurality of slit aperture areas 54 is configured shifted by δ in the length direction, so that a bus wiring in an optional inclined direction can be formed.

Figure 12:
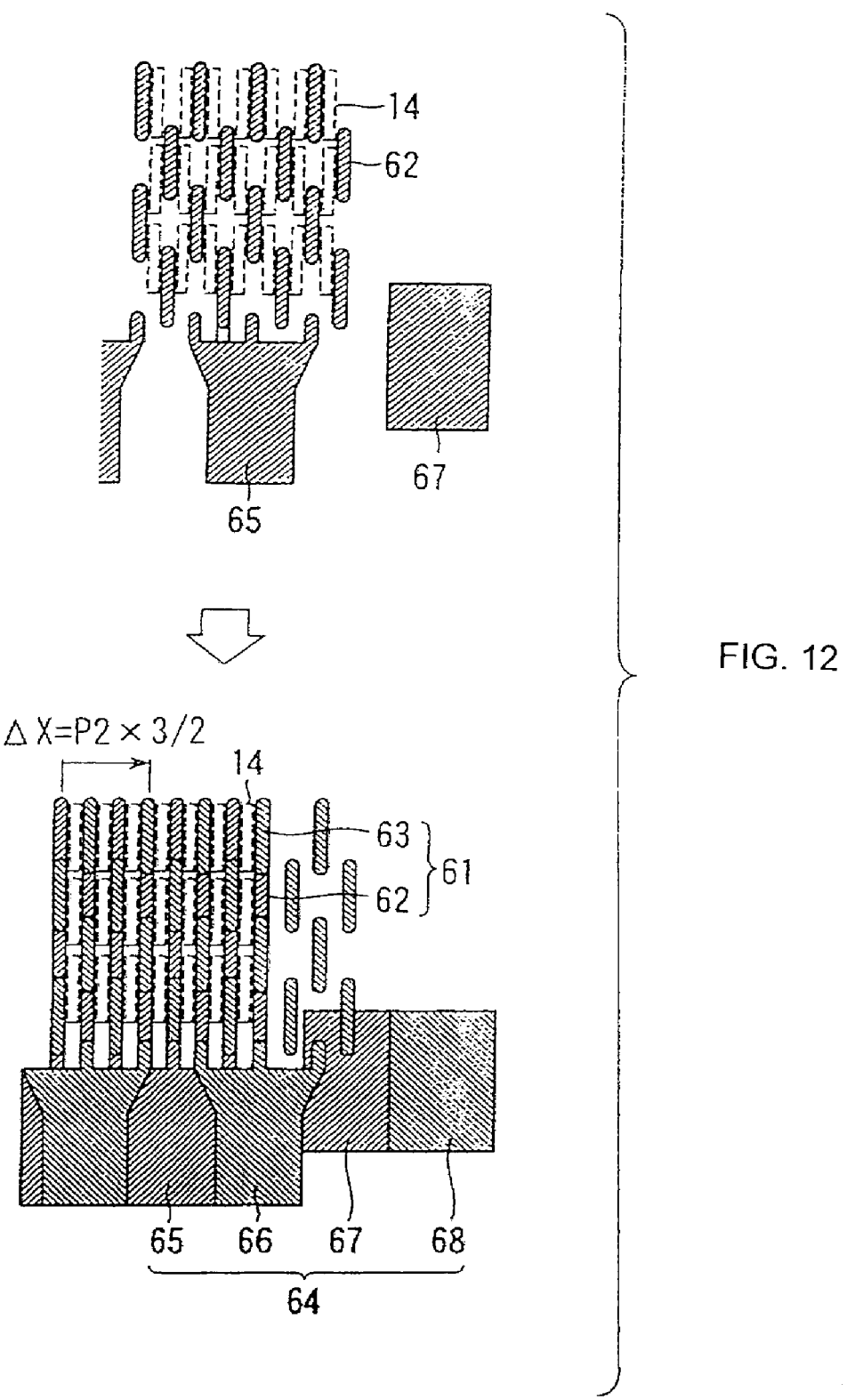
FIG. 12 is an explanatory drawing of formation for auxiliary wiring of the fourth example.

FIG. 12 is an explanatory drawing of formation for the auxiliary wiring of the fourth example. Film forming is performed using the aforementioned vapor deposition mask 51 at an origin position, to thereby form inter-pixel auxiliary wiring elements 62 and auxiliary wiring connection elements 65 and 67 (bus wiring elements 65 and 67).

At this time, the origin position is set so that the slit aperture areas 52 are positioned in the regions between the adjacent pixel electrodes 14.

Next, a film is formed at a position where the vapor deposition mask is moved by $P_3/2 = P_2 \times 3/2$ in the width direction of the respective slit aperture areas, so that an inter-pixel auxiliary wiring elements 63, and bus wiring elements 66 and 68 are partly overlapped, respectively with the inter-pixel auxiliary wiring elements 62 and the bus wiring elements 65 and 67 which are formed previously. Thereby, inter-pixel auxiliary wiring 61 and bus wiring 64 are formed.

Respective patterning overlapped widths D are determined as follows from the relationship of the aforementioned pattern dimensions.

An overlap $D_1$ in the length direction of the inter-pixel auxiliary wiring elements 62 and 63 becomes:

$$D_1 = L_1 - P_1/2$$

Furthermore, respective overlaps $D_2$ in the length direction of the inter-pixel auxiliary wiring elements 62 and 63, and the bus wiring elements 65 and 66 becomes:

$$D_2 = L_1 - P_1/2$$

Moreover, an overlap $D_3$ in the width direction in each of the bus wiring elements 65 and 66, the bus wiring elements 67 and 68, or the bus wiring elements 66 and 67 becomes:

$$D_3 = W_2 - (P_3/2)$$

One example of the numerical values for a case where an auxiliary wiring is formed with the aforementioned vapor deposition mask 51, for a display device of a RGB tricolor configuration is shown in Table 2.

TABLE 2

| | | | |
|---|---|---|---|
| Image size | | 64 mm × 48 mm | 3.2 type |
| Pixel number | | 320 × 240 | QVGA specification |
| Pixel pitch | | 0.2 mm | Definition 127 ppi |
| Sub-pixel region | | 0.067 mm × 0.2 mm | RGB tricolor configuration |
| Pixel electrode | | 0.042 mm × 0.19 mm | Aperture ratio 60% |
| Auxiliary wiring mask | P1 | 0.5 mm | Optional |
| | P2 | 0.134 mm | Two times sub-pixel pitch |
| | P3 | 0.402 mm | P3 = P2 × 3 |
| | L1 | 0.27 mm | L1 > (P1/2) |
| | W1 | 0.02 mm | Less than 0.025 mm between pixel electrodes |
| | L2 | 2.5 mm | Optional |
| | W2 | 0.25 mm | W2 > (P3/2) |
| Auxiliary wiring film overlap width | D1 | 0.02 mm | D1 = L1 − (P1/2) |
| | D2 | 0.02 mm | D2 = L1 − (P1/2) |
| | D3 | 0.049 mm | D3 = W2 − (P3/2) |

In the fourth example of the present invention, since the stripe shape aperture area in which each stripe shape aperture has continuous long shape is not provided, the rigidity of the vapor deposition mask is increased, and the slippage deformation of the pattern can be suppressed. Furthermore, since the vapor depositions are performed two times, being the same as for the first example or the second example, the manufacturing processes are not increased.

Moreover, in the fourth example, the slit aperture areas 53 and 54 are formed to be wide in width direction thereof. Therefore, in the case of high definition, the space between the slit aperture areas 53, 54 pairs, that is, the support portion for the vapor deposition mask, can be made wide. Hence the rigidity of the mask can be further increased.

Fifth Example

Figure 13:
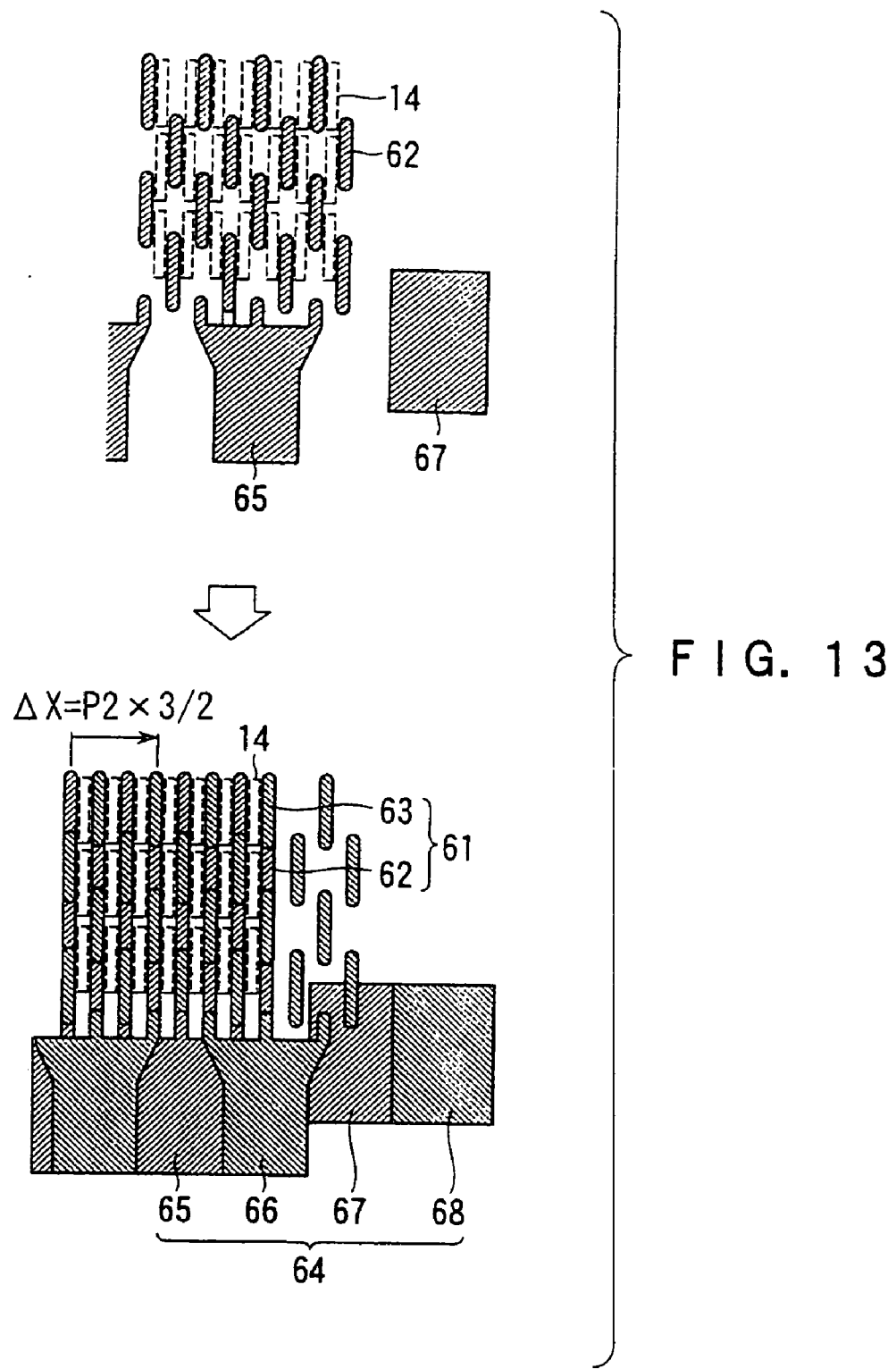
FIG. 13 is an explanatory drawing of formation for auxiliary wiring of a fifth example.

A fifth example of the present invention is described with reference to FIG. 13. Since the basic device structure is the same as for the aforementioned fourth example, only the formation for the auxiliary wiring are described.

A transverse direction slit is provided in the central portion of the slit aperture area 52 in the aforementioned vapor deposition mask 51, and film forming is performed at an origin position using a vapor deposition mask made with cross-shape aperture areas, to thereby form inter-pixel auxiliary wiring elements 72 and bus wiring elements 75 and 77.

At this time, the origin position is set so that the cross-shape aperture areas are positioned in the regions between the adjacent pixel electrodes 14.

Next, a film is formed at a position where the vapor deposition mask is moved by $P_3/2 = P_2 \times 3/2$ in the width direction of the respective slit aperture areas, so that inter-pixel auxiliary wiring element 73, and bus wiring element 76 and 78 are partly overlapped, respectively with the inter-pixel auxiliary wiring elements 72 and the bus wiring elements 75 and 77 which are formed previously. Thereby, inter-pixel auxiliary wiring 71 and bus wiring 74 are formed.

In this fifth example, since the cross-shape aperture areas are provided, a mesh shape inter-pixel auxiliary wiring can be formed, and the transmission resistance of the common electrode can be further reduced. Moreover, even if tearing of the auxiliary wiring due to mask defects occurs in one direction of the cross-shape wiring, a current is supplied from the other direction wiring, and hence there is no loss of uniformity of the resistance of the common electrode.

Sixth Example

Figure 14:
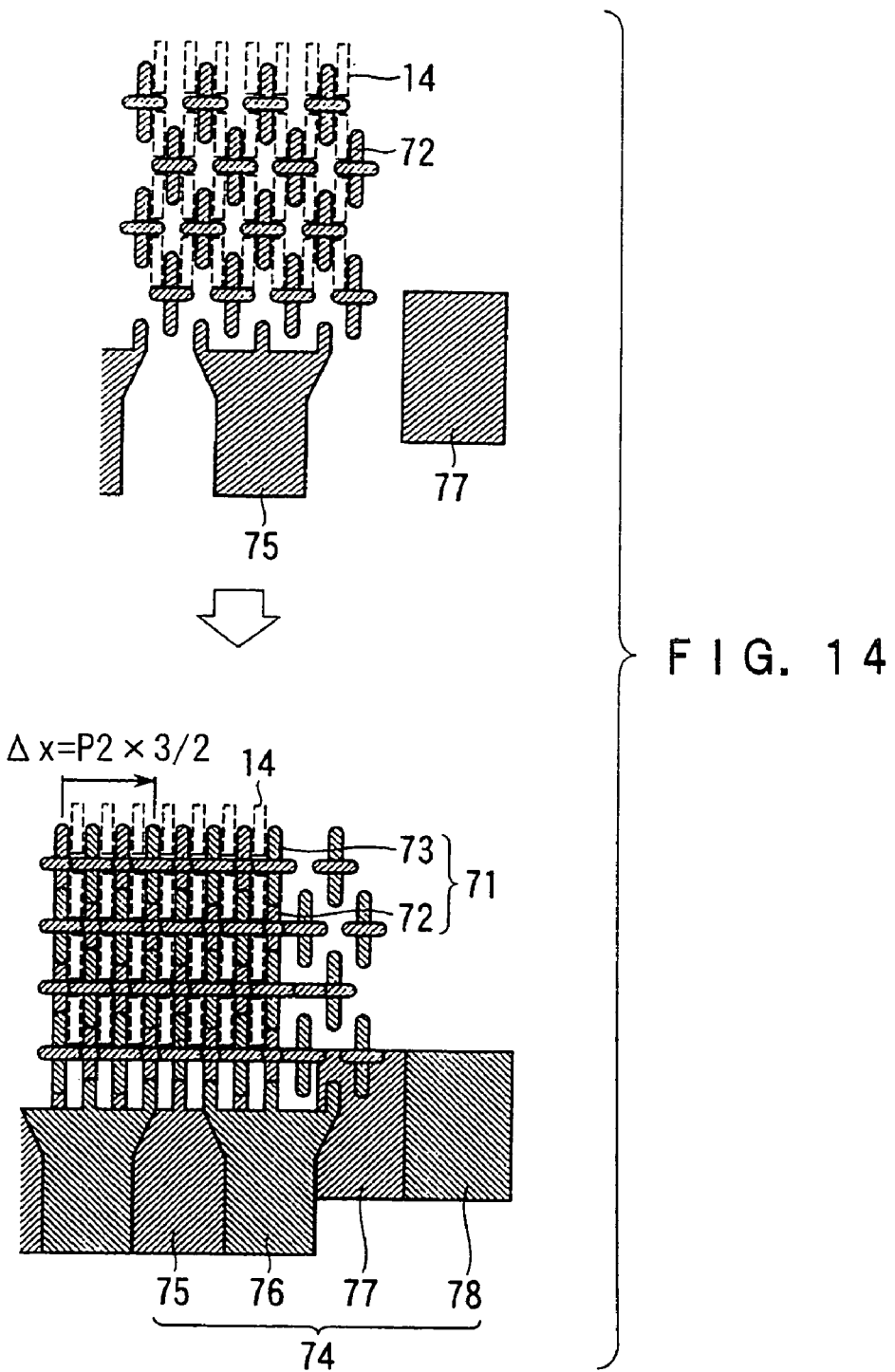
FIG. 14 is an explanatory drawing of formation for auxiliary wiring of a sixth example.
Figure 15:
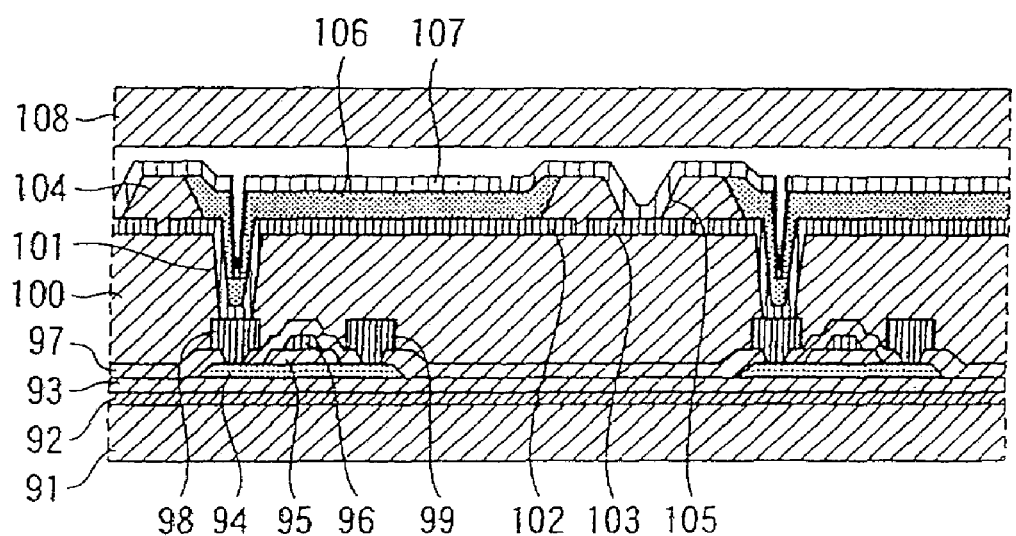
FIG. 15 is a schematic cross-section view of a related art top emission type organic EL display device.

A sixth example of the present invention is described with reference to FIG. 14. Since the basic device structure is the same as for the aforementioned fourth example, only the formation for the auxiliary wiring is described.

In the vapor deposition mask of this example, compared to the single slit aperture 52 in the aforementioned vapor deposition mask 51, a transverse direction slit is provided for connecting between adjacent single slit apertures 52 which are provided at staggered positions, to give a crank-shape aperture area. Film forming is performed at an origin position using this vapor deposition mask, to thereby form inter-pixel auxiliary wiring elements 82 and bus wiring elements 85 and 87.

At this time, the origin position is set so that the crank-shape aperture areas are positioned in the regions between the adjacent pixel electrodes 14.

Next, a film is formed at a position where the vapor deposition mask is moved by $P_3/2 = P_2 \times 3/2$ in the width direction of the respective slit aperture areas, so that inter-pixel auxiliary wiring elements 83, and bus wiring elements 86 and 88 are overlapped, respectively with the inter-pixel auxiliary wiring elements 82, and the bus wiring elements 85 and 87 which are formed previously. Thereby, inter-pixel auxiliary wiring 81 and bus wiring 84 are formed.

In the sixth example, since the crank-shape aperture areas are provided, then as for the aforementioned fifth example, a mesh shape inter-pixel auxiliary wiring can be formed, and the transmission resistance of the common electrode can be further reduced. Moreover, even if tearing of the auxiliary wiring due to mask defects occurs in one direction of the crank-shape wiring, a current is supplied from the other direction wiring, and hence there is no loss of uniformity of the resistance of the common electrode.

In the above, various examples of the present invention have been described, however the present invention is not limited or construed to the conditions and configurations described for the respective examples, and various modifications are possible. For example, in the aforementioned respective examples, the configuration of the organic EL layer is not shown, however this is appropriately selected from amongst known organic EL materials in accordance with the luminescent colors.

Furthermore, in the aforementioned respective examples, ITO is used as the translucent material constituting the common electrode. However this is not limited to ITO, and other transparent oxide conductive materials such as IZO or ZnO may be used. Moreover, a metallic thin film of for example Al or Ag formed as a thin film of approximately 20 nm may be used.

Furthermore also in the case of the aforementioned third example, the slit aperture area used for the inter-pixel auxiliary wiring may be a cross-shape aperture area or a crank-shape aperture area as in the fifth example or the sixth example, thereby a mesh shape inter-pixel auxiliary wiring can be formed.

Moreover, in the aforementioned respective examples, a glass substrate is used as the substrate. However since the display devices of the respective embodiments are a top emission type, the substrate need not be transparent, and a conducting substrate such as of stainless steel, or a nonconductive opaque substrate may be used.

Furthermore, in the aforementioned respective examples, the description has been for a full color display device. However the invention is applicable to a different hue glass display device where a plurality of colors are appropriately combined. Moreover, the invention is also applicable to the case of constructing a single color display device.

As an applicable example of the present invention, a two dimensional matrix display device is a typical example, but the present invention is not limited to the display device, and can be applied to a large-size single light source such as a light source for mood illumination.

What is claimed is:

1. An organic electroluminescent display device comprising a wiring layer, an insulating layer, a first electrode, an organic electroluminescent layer, and a second electrode that are laminated on a substrate in sequence from the substrate side, wherein:
   the second electrode is a layer above the organic electroluminescent layer and covers the organic electroluminescent layer;
   the organic electroluminescent display device has a plurality of light emitting pixels radiating light that is emitted from the organic electroluminescent layer and is transmitted through the second electrode; and
   the organic electroluminescent display device further comprises wiring that conducts with the second electrode, the wiring being arranged between the light emitting pixels and being provided at the upper side of the organic electroluminescent layer either
      on top of and in contact with the organic electroluminescent layer, or
      on top of the second electrode such that the wiring is in contact with the upper surface of the second electrode.

2. The organic electroluminescent display device according to claim 1, wherein the wiring is configured to be continuous such that at least a part of mutual film forming patterns of the respective wiring is overlapped.

3. The organic electroluminescent display device according to claim 2, wherein alternate wirings intersect so as to be connected to each other in a region corresponding to a region outside of the light emitting pixels.

4. An organic electroluminescent display device comprising:
   a substrate;
   a wiring layer;
   an insulating layer;
   a first electrode;
   an organic electroluminescent layer;
   a second electrode; and
   wiring which conducts with the second electrode, wherein
   the second electrode is a layer above the organic electroluminescent layer and covers the organic electroluminescent layer,
   the organic electroluminescent display device has a plurality of light emitting pixels radiating light that is emitted from the organic electroluminescent layer and is transmitted through the second electrode, and
   the wiring is arranged between the light emitting pixels, and is provided at the upper side of the organic electroluminescent layer either
      on top of and in contact with the organic electroluminescent layer, or
      on top of the second electrode such that the wiring is in contact with the upper surface of the second electrode.

5. The organic electroluminescent display device according to claim 4, wherein the wiring comprises a plurality of shape elements and at least a part of the shape elements is mutually overlapped.

6. The organic electroluminescent display device according to claim 5, wherein the plurality of shape elements are arranged in a mutually staggered form.

7. The organic electroluminescent display device according to claim 5, wherein the plurality of shape elements includes a plurality of types of shape elements, and constitutes the wiring in which at least a part of the shape elements of the plurality of types is mutually overlapped.

8. The organic electroluminescent display device according to claim 7, wherein the shape elements of the plurality of types comprise a first shape element and a second shape element, and the second shape element is arranged on an outside periphery of a region where the first shape element is arranged.

9. The organic electroluminescent display device according to claim 8, wherein the plurality of second shape elements are arranged with positions thereof shifted from each other on the outside periphery of the region where the first shape element is arranged.

10. The organic electroluminescent display device according to claim 4, wherein the wiring comprises a plurality of shape elements, at least a part of the shape elements is mutually overlapped, and each shape element has a dimension exceeding the dimension of each of the light emitting pixels by no more than the length with which each of the shape elements overlap with each other.

* * * * *